United States Patent
Zeng et al.

(10) Patent No.: US 7,522,575 B2
(45) Date of Patent: Apr. 21, 2009

(54) METHOD AND SYSTEM FOR DECODING CONTROL CHANNELS USING REPETITION REDUNDANCY BASED ON WEIGHTED BITS

(75) Inventors: Huaiyu (Hanks) Zeng, Red Bank, NJ (US); Nelson Sollenberger, Farmingdale, NJ (US); Arie Heiman, Rannana (IL)

(73) Assignee: Broadcom Corporation, Irvine, CA (US)

( * ) Notice: Subject to any disclaimer, the term of this patent is extended or adjusted under 35 U.S.C. 154(b) by 461 days.

(21) Appl. No.: 11/325,752

(22) Filed: Jan. 5, 2006

(65) Prior Publication Data

US 2007/0140210 A1 Jun. 21, 2007

Related U.S. Application Data

(60) Provisional application No. 60/752,706, filed on Dec. 21, 2005.

(51) Int. Cl.
*H04J 1/00* (2006.01)
(52) U.S. Cl. .................................................. 370/343
(58) Field of Classification Search ................. 370/328, 370/343
See application file for complete search history.

(56) References Cited

U.S. PATENT DOCUMENTS 5,341,401 A * 8/1994 Farjh et al. .................. 375/341

2006/0221880 A1 * 10/2006 Riddington et al. ......... 370/310

OTHER PUBLICATIONS

Mark Austin, Ph.D., Cingular Wireless, *SAIC and Synchronized Networks for Increased GSM Capacity*, 3G Americas' SAIC Working Group, Sep. 2003, pp. 1-26.

* cited by examiner

*Primary Examiner*—Alexander Eisen
*Assistant Examiner*—Eric Elcenko
(74) *Attorney, Agent, or Firm*—McAndrews, Held & Malloy, Ltd

(57) ABSTRACT

Various aspects of a system for decoding control channels using repetition redundancy based on weighted bits may include a processor that enables receipt of a current encoded information block from a signal received wirelessly via a control channel. The processor may also enable computation of an adjusted encoded information block based on the current encoded information block and at least one previous encoded information block that is weighted. Aspects of the corresponding method may include receiving a signal wirelessly via a control channel. A current encoded information block may be received from the received signal. An adjusted encoded information block may be computed based on the current encoded information block and at least one previous encoded information block that is weighted. The control channel may be a slow associated control channel (SACCH) channel.

18 Claims, 12 Drawing Sheets

METHOD AND SYSTEM FOR DECODING CONTROL CHANNELS USING REPETITION REDUNDANCY BASED ON WEIGHTED BITS

CROSS-REFERENCE TO RELATED APPLICATIONS/INCORPORATION BY REFERENCE

This application makes reference to, claims priority to, and claims the benefit of U.S. Provisional Application Ser. No. 60/752,706 filed on Dec. 21, 2005.

This application also makes reference to:
U.S. application Ser. No. 11/325,721 filed on even date herewith;
U.S. application Ser. No. 11/325,720 filed on even date herewith;
U.S. application Ser. No. 11/325,751 filed on even date herewith;
U.S. application Ser. No. 11/325,808 filed on even date herewith;
U.S. application Ser. No. 11/325,756 filed on even date herewith;
U.S. application Ser. No. 11/150,759 filed on even date herewith;
U.S. application Ser. No. 11/150,926 filed on Jun. 13, 2005;
U.S. application Ser. No. 11/271,692 filed on Nov. 10, 2005;
U.S. application Ser. No. 11/150,931 filed on Jun. 13, 2005;
U.S. application Ser. No. 11/150,957 filed on Jun. 13, 2005;
U.S. application Ser. No. 11/151,030 filed on Jun. 13, 2005;
U.S. application Ser. No. 11/151,029 filed on Jun. 13, 2005;
U.S. application Ser. No. 11/189,509 filed on Jul. 26, 2005; and
U.S. application Ser. No. 11/189,634 filed on Jul. 26, 2005.

Each of the above stated applications is hereby incorporated herein by reference in its entirety.

FIELD OF THE INVENTION

Certain embodiments of the invention relate to cellular communication systems. More specifically, certain embodiments of the invention relate to a method and system for decoding control channels using repetition redundancy based on weighted bits.

BACKGROUND OF THE INVENTION

Cellular communication systems provide wireless communication services in many populated areas of the world. While cellular communication systems were initially constructed to service voice communications, they are now called upon to support data communications as well. The demand for data communication services has exploded with the acceptance and widespread use of the Internet. While data communications have historically been serviced via wired connections, cellular users now demand that their wireless units also support data communications. Many wireless subscribers now expect to be able to "surf" the Internet, access their email, and perform other data communication activities using their cellular phones, wireless personal data assistants, wirelessly linked notebook computers, and/or other wireless devices. The demand for wireless communication system data communications continues to increase with time. Thus, existing wireless communication systems are currently being created or modified to service these burgeoning data communication demands.

Cellular networks include a network infrastructure that wirelessly communicates with wireless terminals within a respective service area. The network infrastructure typically includes a plurality of base stations dispersed throughout the service area, each of which supports wireless communications within a respective cell or set of sectors. The base stations may be coupled to base station controllers (BSCs), with each BSC serving a plurality of base stations. Each BSC couples to a mobile switching center (MSC). Each BSC also typically directly or indirectly couples to the Internet.

In operation, each base station (BS) communicates with a plurality of wireless terminals operating in its cell/sectors. A BSC coupled to the base station routes voice communications between the MSC and the serving base station. The MSC routes the voice communication to another MSC or to the PSTN, for example. The BSCs route data communications between a servicing base station and a packet data network that may include or couple to the Internet. Transmissions from base stations to wireless terminals are referred to as "forward link or downlink" transmissions while transmissions from wireless terminals to base stations are referred to as "reverse link or uplink" transmissions.

Wireless links between base stations and their serviced wireless terminals typically operate according to one or more of a plurality of operating standards. These operating standards define the manner in which the wireless link may be allocated, setup, serviced, and torn down. One popular cellular standard is the Global System for Mobile telecommunications (GSM) standard. The GSM standard, or simply GSM, is predominant in Europe and is in use around the globe. While GSM originally serviced only voice communications, it has been modified to also service data communications. GSM General Packet Radio Service (GPRS) operations and the Enhanced Data rates for GSM (or Global) Evolution (EDGE) operations coexist with GSM by sharing the channel bandwidth, slot structure, and slot timing of the GSM standard. The GPRS operations and the EDGE operations may also serve as migration paths for other standards as well, e.g., IS-136 and Pacific Digital Cellular (PDC).

In order for EDGE to provide increased data rates within a 200 KHz GSM channel, it employs a higher order modulation, 8-PSK (octal phase shift keying), in addition to GSM's standard Gaussian Minimum Shift Keying (GMSK) modulation. EDGE allows for nine different (autonomously and rapidly selectable) air interface formats, known as Modulation and Coding schemes (MCSs), with varying degrees of error control protection. Low MCS modes, (MCS 1-4) use GMSK (low data rate) while high MCS modes (MCS 5-9) use 8-PSK (high data rate) modulation for over the air transmissions, depending upon the instantaneous demands of the application.

After a wireless link is established between a base station (BS) and a wireless terminal or a mobile station (MS), the base station may communicate control information and/or system information to the mobile station. The MS may receive signals from the BS via a control channel. The MS may decode the signals received via the control channel to extract information.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and method for decoding control channels using repetition redundancy based on weighted bits, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for decoding control channels using repetition redundancy based on weighted bits. Aspects of a system for decoding control channels using repetition redundancy based on weighted bits may include a processor that enables receipt of a signal wirelessly via a control channel. The control channel may be a slow associated control channel (SACCH). The processor may enable receipt of a current encoded information block from the received signal. The processor may also enable computation of an adjusted encoded information block based on the current encoded information block, and at least one previous encoded information block that is weighted. The processor may enable computation of a bit in the adjusted encoded information block based on a corresponding bit in the current encoded information block, and a corresponding bit in the one or more previous encoded information blocks that are weighted. The processor may enable computation of a value for the bit in the adjusted encoded information block based on a sum of a value for the corresponding bit in the current encoded information block, and a weighted value for the corresponding bit in the one or more previous encoded information blocks.

Figure 1A:
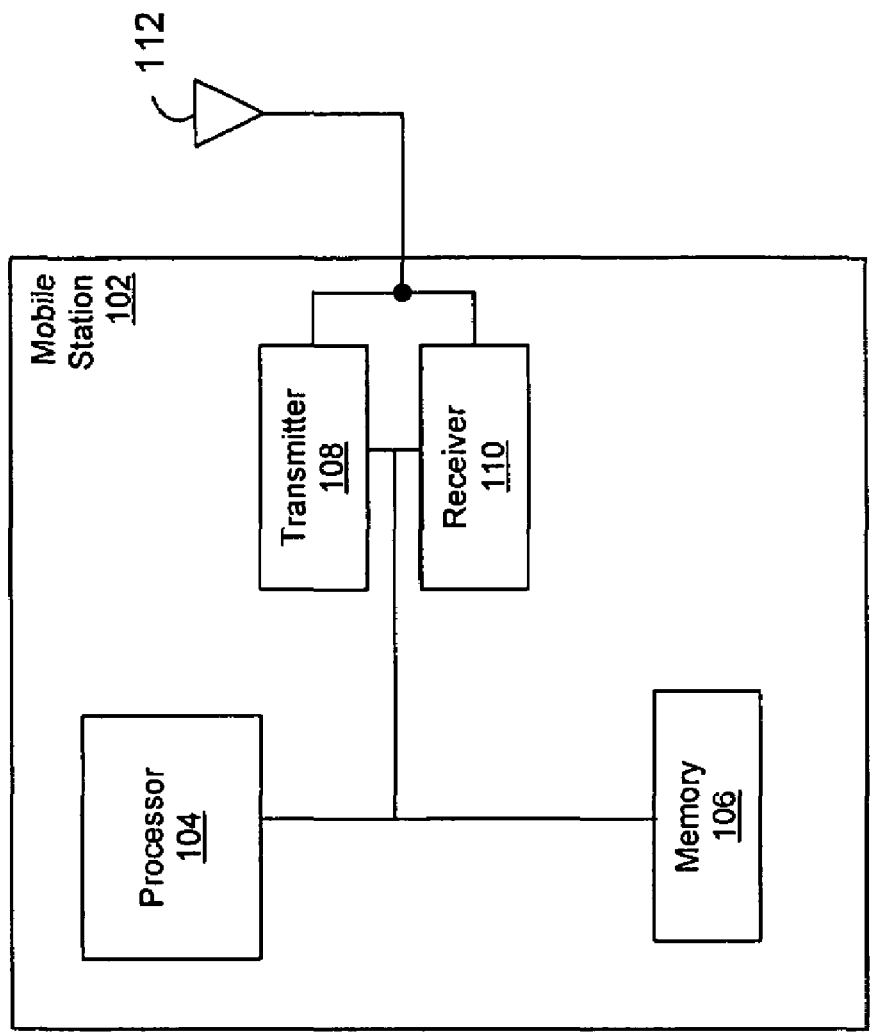
FIG. 1A is a block diagram of an exemplary mobile station, which may be utilized in connection with an embodiment of the invention.

FIG. 1A is a block diagram of an exemplary mobile station, which may be utilized in connection with an embodiment of the invention. Referring to FIG. 1A, there is shown a mobile station (MS) 102, and an antenna 112. The mobile station may comprise a processor 104, memory 106, a transmitter 108, and a receiver 110. The processor 104 may comprise suitable logic, circuitry, and/or code that may enable processing of information and/or data associated with the transmission and reception of signals at the MS 102. The processor 104 may, for example, compute an adjusted encoded information block based on a received current encoded information block, and one or more previous encoded information blocks that are weighted. The memory 106 may comprise suitable logic, circuitry, and/or code that may be utilized to store data and/or control information that may be utilized in the operation of at least a portion of the MS 102. For example, the memory 106 may be utilized to store intermediate results of calculations related to the computation of signal level measurements and/or signal quality measurements. The memory 106 may also be utilized to store configuration information related to a coding and/or decoding rate that may be utilized to receive signals at the MS 102.

The transmitter 106 may comprise suitable circuitry, logic, and/or code that may be utilized to transmit signals wirelessly. The transmitter 106 may enable various coding functions, signal modulation, and/or signal amplification. The receiver 108 may comprise suitable circuitry, logic, and/or code that may be utilized to receive wireless signals. The receiver 108 may enable decoding functions, signal demodulation, and/or signal amplification. The antenna 112 may comprise suitable circuitry, logic, and/or code that may enable the reception and transmission of wireless signals. The receiver 108 may utilize the antenna 112 to receive signals via at least one control channel. The one or more control channels may include a slow associated control channel (SACCH).

Figure 1B:
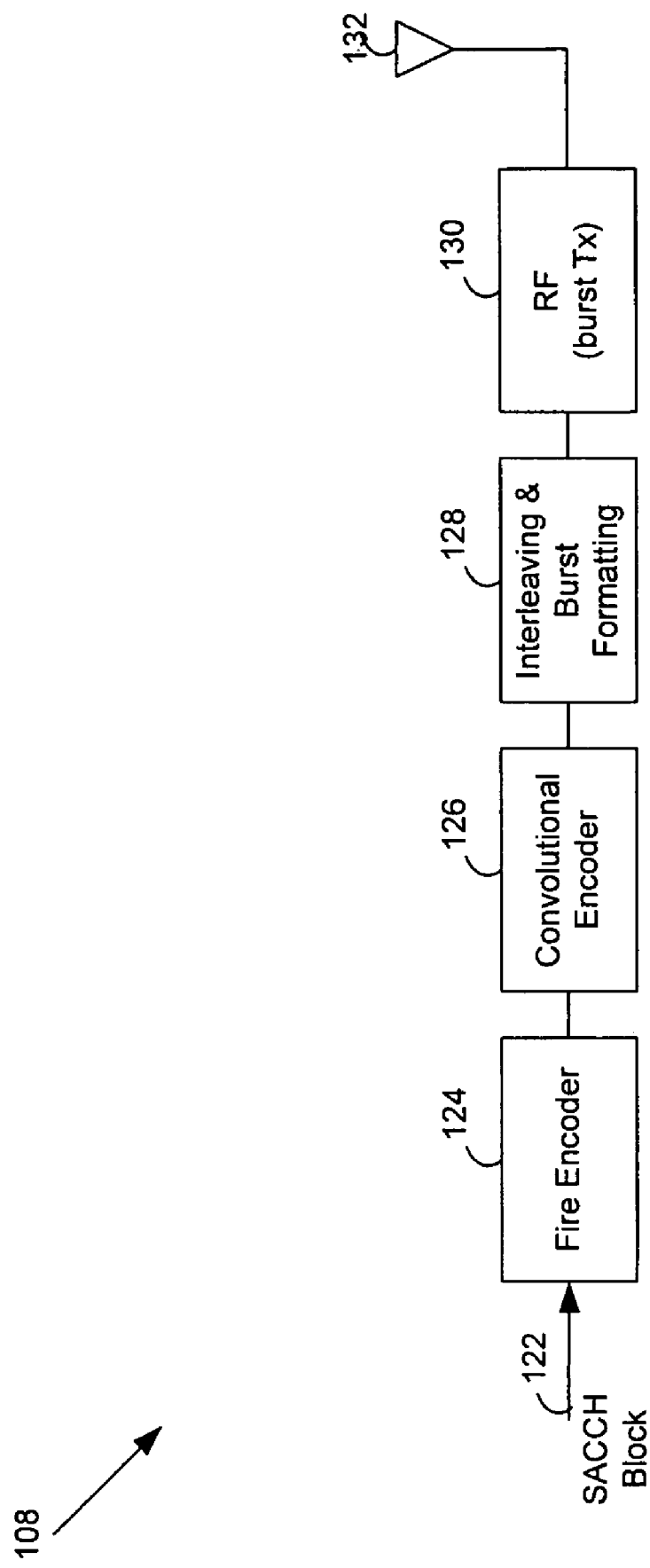
FIG. 1B is a block diagram of an exemplary mobile station (MS) transmitter, which may be utilized in connection with an embodiment of the invention.

FIG. 1B is a block diagram of an exemplary mobile station (MS) transmitter, which may be utilized in connection with an embodiment of the invention. Referring to FIG. 1B, the transmitter 108 may comprise a fire encoder 124, a convolutional encoder 126, an interleaving and burst formatting block (IBFB) 128, a radio frequency block (RFB) 130, and an antenna 132.

The fire encoder 124 may comprise suitable circuitry, logic, and/or code and may enable block coding of received bit sequence, such as the SACCH block 122. The SACCH block 122 may comprise up to 184 bits, for example. The fire encoder 124 may append the received SACCH block 122 with 40 parity bits, for example. The parity bits may be calculated by the encoder 124 based on the SACCH block 122 and may be used by a receiver during error correction. Furthermore, the parity bits may be utilized at a receiver of the SACCH block 122 transmitted by the MS 102, for example a wireless network base station, to detect and/or correct errors, in the received SACCH block. In this regard, the parity bits may comprise an outer code in the sense that the parity bits may be calculated based on the block of bits contained in the SACCH block 122.

The convolutional encoder 126 may comprise suitable circuitry, logic, and/or code and may enable ½ rate binary convolutional code (BCC) encoding of fire encoded data, for example. The ½ rate BCC may be utilized to generate 2 coded bits based on each single information bit from the fire encoded data block. The 2 bits may include redundant information that may be utilized at a receiver to detect and/or correct errors in the received single information bit. In this regard, the BCC may comprise an inner code in the sense that the coded bits generated by a BCC may be calculated based on a portion of the bits contained within the SACCH block 122.

The IBFB 128 may comprise suitable circuitry, logic, and/or code and may enable interleaving of encoded bits so that contiguous coded bits are not arranged in sequential order during transmission. In this regard, the interleaving may be utilized to enable recovery, at a receiver, from burst errors that may cause errors in contiguous blocks of bits during transmission. When the bits are subsequently deinterleaved at the receiver, the contiguous block of bits that may have suffered a burst of errors may no longer be contiguous. This may enable the receiver to detect and/or correct the errors in the deinterleaved bit stream. The IFBF 128 may also enable burst formatting or adding framing bits to the interleaved encoded bitstream, resulting in burst formation. Burst formatting may comprise, for example, adding a training sequence to the interleaved and encoded bitstream.

The RFB 130 may comprise suitable circuitry, logic, and/or code and may enable further processing, such as modulation, signal amplification, and filtering of the interleaved and burst-formatted signal received form the IBFB 128. The resulting RF signal may be transmitted via the antenna 132.

Figure 1C:
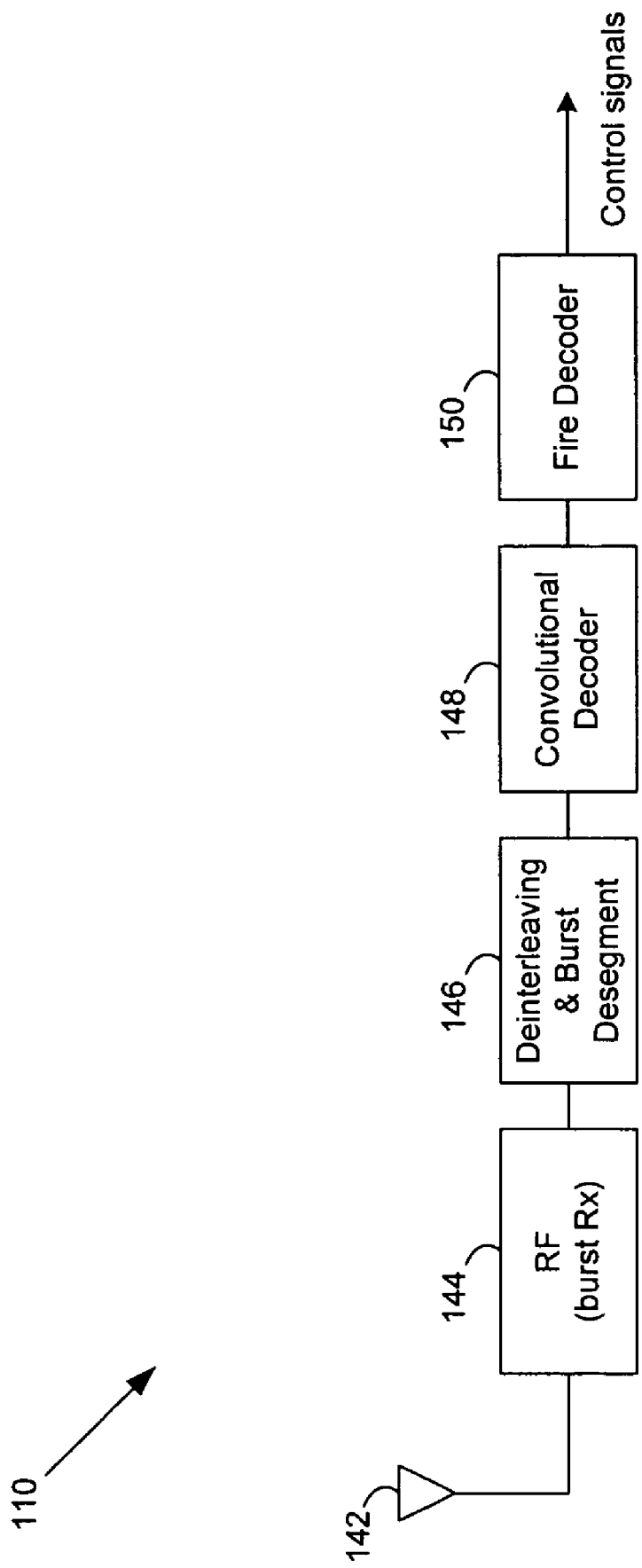
FIG. 1C is a block diagram of an exemplary mobile station (MS) receiver, in accordance with an embodiment of the invention.

FIG. 1C is a block diagram of an exemplary mobile station (MS) receiver, in accordance with an embodiment of the invention. Referring to FIG. 1C, a receiver 110 may comprise a radio frequency block (RFB) 144, an antenna 142, a deinterleaver and burst desegmentation block (DBDB) 146, a convolutional decoder 148, and a fire decoder 150.

The RFB 144 may comprise suitable circuitry, logic, and/or code and may enable processing of RF bursts received via the antenna 142. For example, the RFB 144 may enable downconversion, signal amplification and filtering of the received RF bursts to generate interleaved and burst-formatted encoded bitstream data.

The DBDB 146 may comprise suitable circuitry, logic, and/or code and may enable deinterleaving of interleaved bitstream data. The DBDB 146 may also enable burst desegmentation by removing framing bits from the received bitstream data.

The convolutional decoder 148 may comprise suitable circuitry, logic, and/or code and may enable ½ rate convolutional decoding, for example, of the deinterleaved and desegmented data received from the DBDB 146. The convolutional decoder 148 may utilize Viterbi decoding to provide error detection and/or correction, and may generate, for example, 1 decoded bit for each 2 input encoded bits. The Viterbi decoded data may be communicated to the fire decoder 150. The fire decoder 150 may comprise suitable circuitry, logic, and/or code and may enable decoding of a bit sequence received from the convolutional decoder 148. The fire decoder 150 may extract 40 parity bits, for example, from the received bit sequence to generate decoded data. The decoded data may comprise up to 184 bits, for example. The decoded data may be, for example, a received SACCH block. The fire decoder 150 may utilize the extracted parity bits to detect and/or correct errors within the received SACCH block. The received SACCH block may comprise control information. The fire decoder 150 may also check the validity of the received data, for example.

Figure 2:
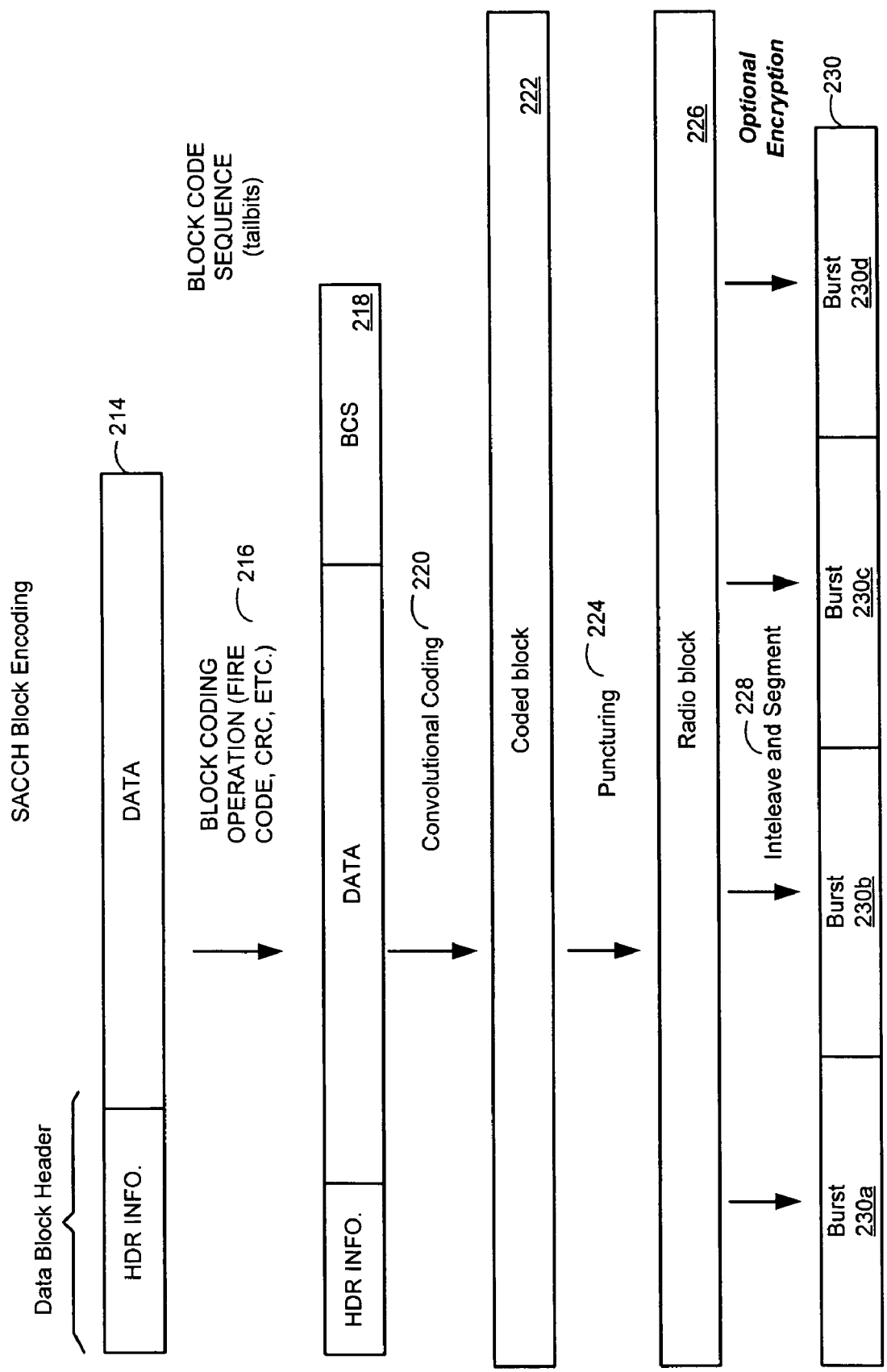
FIG. 2 is a block diagram illustrating exemplary SACCH block encoding, which may be utilized in connection with an embodiment of the invention.

FIG. 2 is a block diagram illustrating exemplary SACCH block encoding, which may be utilized in connection with an embodiment of the invention. Referring to FIGS. 2 and 1B, data 214 may represent a block of information referred to as a SACCH block 122. The SACCH block 122 may comprise payload information received from a layer 3 (L3) protocol entity referred to as L3 information, and a header, referred to as a layer 1 (L1) header, for example. The L3 information may comprise up to 168-bits of information, for example. The L1 header may comprise 16 bits of information, for example.

Block coding operations 216 may then be performed on the data block 214 resulting in a block coding sequence (BCS) 218, which is appended to the data 214. The BCS 218 may represent parity bits, for example. The block coding operation 216 may be used for error detection/correction for the data block 214 and may comprise a cyclic redundancy check (CRC) and/or a Fire Code operation.

Fire codes allow for error correction and/or error detection. Fire codes may represent a shortened binary cyclic code that appends redundancy bits to the data block 214. After block coding has supplemented the data 214 with redundancy bits for error detection and/or error correction, convolutional coding 220 may be performed by the convolutional encoder 126. The convolutional coding 220 may increase the ability to detect and correct bit errors that may occur during transmission of a signal via a wireless communications channel. The convolutional encoding operation 220 may result in a coded data block 222. Some redundant bits generated by the convolutional encoder 126 may be removed prior to transmission via the puncturing operation 224. Convolutional coding 220 and/or puncturing 224 may be utilized to generate a radio block 226. In this regard, the puncturing operation 224 may increase the rate of the convolutional code, for example from ½ to ¾. For a BCC rate of ½, there may be 2 redundant bits and 2 information bits for each 4 bits in the radio block 226. For a BCC rate of ¾, there may be 1 redundant bit and 3 information bits for each 4 bits in the radio block 226.

The convolutionally encoded and punctured bits of the radio block 226 may be communicated to the IBFB 128, which may utilize an interleave and shuffle operation to shuffle various bit streams and segments of the interleaved bit streams into the 4 bursts 230a, 230b, 230c, and 230d. The bursts 230a, 230b, 230c, and 230d may each comprise at least a portion of the bits contained in the radio block 226. Each of the bursts 230a, 230b, 230c, and 230d modulated and converted to RF signals by the RFB 130. The RF signals may be transmitted via the antenna 132. The RF signal, which comprises burst 230a, may be transmitted at a different time instant from the time instant that the RF signal, which transmits burst 230b, is transmitted. The RF signal, which comprises burst 230b, may be transmitted at a different time instant from the time instant that the RF signal which transmits burst 230c is transmitted. The RF signal, which comprises burst 230c, may be transmitted at a different time instant from the time instant that the RF signal which comprises burst 230d is transmitted.

Figure 3:
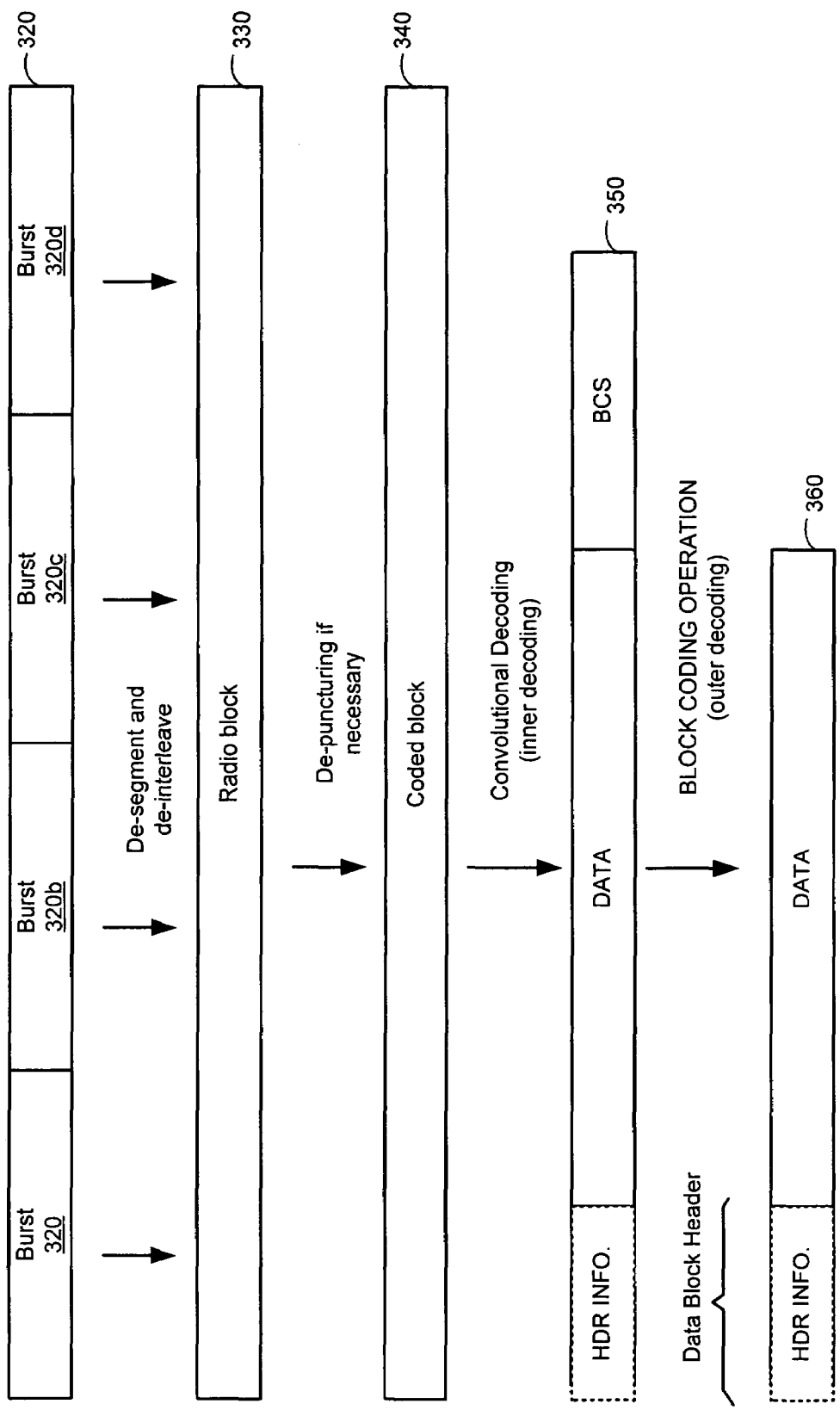
FIG. 3 is a block diagram illustrating exemplary SACCH block decoding at a MS, in accordance with an embodiment of the invention.

FIG. 3 is a block diagram illustrating exemplary .SACCH block decoding at a MS, in accordance with an embodiment of the invention. Referring to FIGS. 3 and 1C, interleaved and segmented bursts 320a, 320b, 320c, and 320d may be received by the DBDB 146. The receiving MS 102 may individual segmented bursts 320a, 320b, 320c, and 320d at different time instants. At least a portion of the segmented bursts 320a, 320b, 320c, and/or 320d may be temporarily stored in memory 106. The DBDB 146 may de-segment and de-interleave the interleaved and segmented bursts 320a, 320b, 320c, and 320d to generate an encoded radio block 330. The encoded radio block 330 may be communicated to the convolutional decoder 148. A de-puncturing operation may be performed on the encoded radio block 330 by the convolutional decoder 148 to generate a coded block 340. De-puncturing may comprise inserting redundant bits that may have been removed during puncturing prior to transmission.

The convolutional decoder 148 may decode the coded block 340 to generate the header, data, and tailbits 350. The generated header, data, and tailbits 350 may be communicated to the fire decoder 150. The fire decoder 150 may apply a block decoding operation, also referred to as an outer decoding operation, to extract the tailbits and generate header information and data 360. The header and data 360 may comprise at least a portion of a received SACCH block. The SACCH block may comprise control information. The fire decoder 150 may enable detection and/or correction of erroneous bits in the generated header and data portion of the header, data, and BCS 350. If an error in at least one bit may be detected but not corrected, the fire code decoder 150 may provide an indication that the decoded header and data 360 contains uncorrected bit errors.

Figure 4:
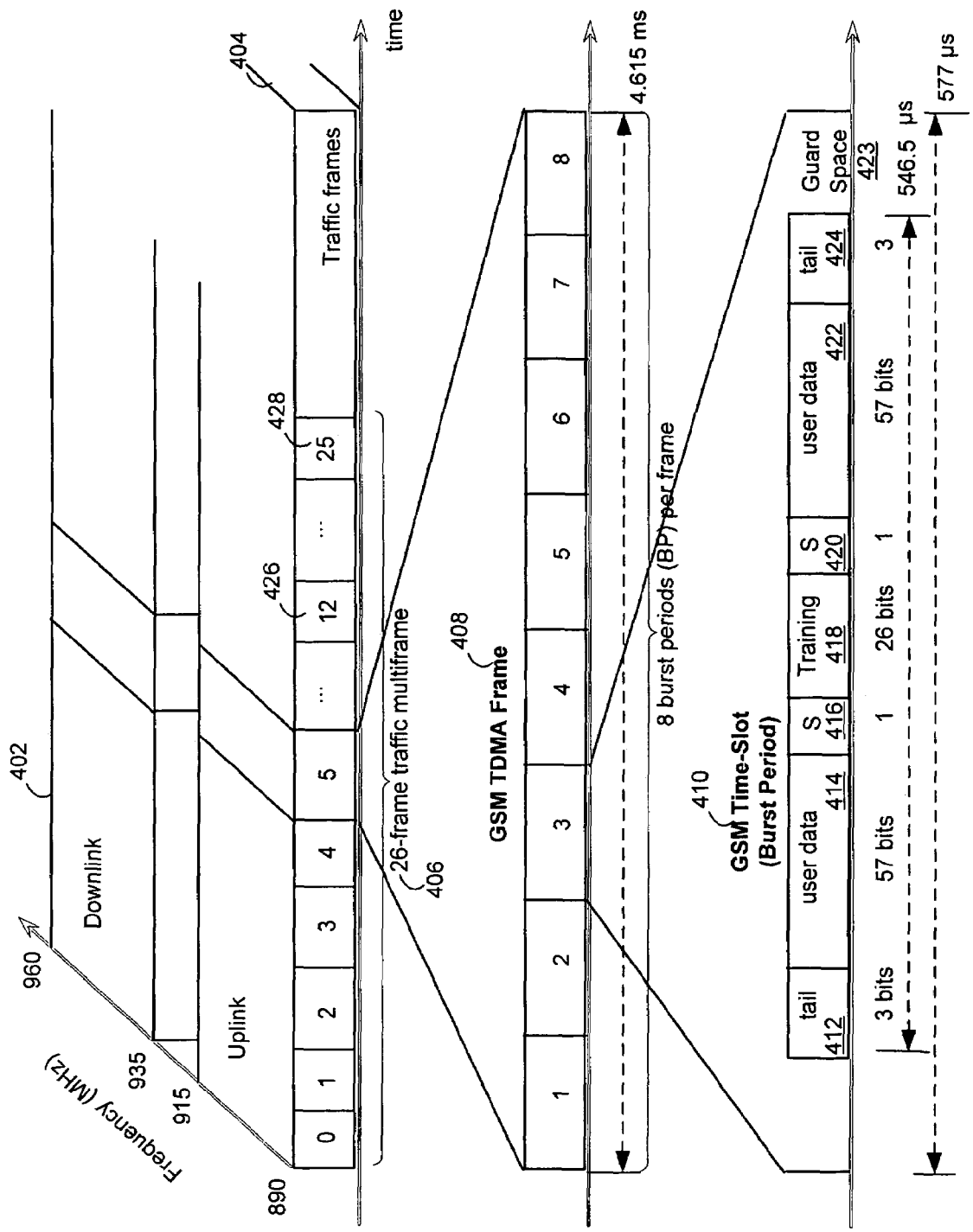
FIG. 4 is a graph illustrating an exemplary GSM frame and a burst period, which may be used in connection with an embodiment of the invention.

FIG. 4 is a graph illustrating an exemplary GSM frame and a burst period, which may be used in connection with an embodiment of the invention. GSM utilizes a combination of Time and Frequency Division Multiple Access (TDMA/FDMA). Referring to FIG. 4, there is shown a downlink frequency band 402, an uplink frequency band 404, a GSM TDMA frame 408 and a GSM timeslot or burst period 410. The GSM downlink frequency band 402 comprises a range of frequencies spanning 935-960 MHz, for example. The GSM uplink frequency band 404 comprises a range of frequencies spanning 890-915 MHz, for example. The FDMA aspect of GSM involves the division of frequency of the 25 MHz bandwidth for the uplink frequency band 404 and the downlink frequency band 402 into 124 carrier frequencies respectively, each of which comprises a bandwidth of 200 kHz. One or more carrier frequencies may be assigned per base station. The TDMA aspect of GSM involves the division in time of each carrier frequency into 8 time-slots, or burst periods (BPs), such as BP 410. An MS 102 may receive information via timeslots associated with a downlink channel. Timeslots associated with an uplink channel may be utilized by an MS 102 to transmit information.

The GSM timeslot or BP 410 may comprise tail portions 412 and 424, user data portions 414 and 422, stealing bits 416 and 420, a training sequence 418, and guard space 423. The tail portions 412 and 424 may each comprise 3 bits. The user data portions 414 and 422 may each comprise 57 bits, for example, and may be used for data transmission. The stealing bits 416 and 420 may each comprise 1 bit and may be used by fast associated control channel (FACCH) messages. The training sequence 418 may comprise 26 bits, for example, and may be utilized by an MS 102 to synchronize and compensate for time dispersion produced by multipath propagation. The guard space 423 may comprise a total of 8.25 bits, for example, and may allow for propagation time delay in the arrival of bursts. The burst period 410 may be transmitted in 0.577 milliseconds.

Each group of 8 time-slots or burst periods, such as the burst period 410, may form a GSM TDMA frame 408. The GSM frame 408 may be transmitted every 4.615 ms. GSM frames, such as the GSM frame 408, may be further grouped into multiframes. A GSM multiframe may comprise 26 TDMA frames or 51 TDMA frames. A GSM multiframe that is utilized to communicate information via a traffic channel, for example a TCH, or via a control channel, for example a SACCH or FACCH, may comprise 26 TDMA frames. A 26-frame multiframe may be referred to as a traffic multiframe. A GSM multiframe that is utilized to communicate information via a control channel, for example a broadcast control channel (BCCH), may comprise 51 TDMA frames. A 51-frame multiframe may be referred to as a control multiframe. For example, the GSM multiframe 406 may comprise 26 TDMA frames, numbered 0, 1, . . . , 25. The 26-frame multiframe 406 may comprise 24 frames comprising traffic channels (TCH) and/or FACCH, which may be communicated in frames 0, 1, . . . , 11 and frames 13, 14, . . . , 24. The $13^{th}$ frame 426 may be used to communicate information via the SACCH. The $25^{th}$ frame 428 may comprise an idle frame that is not utilized to communicate information. During the $25^{th}$ frame 428 within a GSM multiframe 406, a frame associated with the corresponding GSM control multiframe, utilized to communicate information via a control channel, may be transmitted. Thus, for example, an MS 102 that receives the GSM traffic multiframe, via a TCH downlink frequency may retune to a BCCH downlink frequency to receive a frame from the GSM control multiframe during transmission of the $25^{th}$ frame 428 within the GSM traffic multiframe. The aggregate number of frames that may be transmitted during the transmission of a complete GSM control multiframe may comprise 1,326 frames. The block of 1,326 frames, comprising traffic frames and control frames, may be referred to as a superframe.

Figure 5:
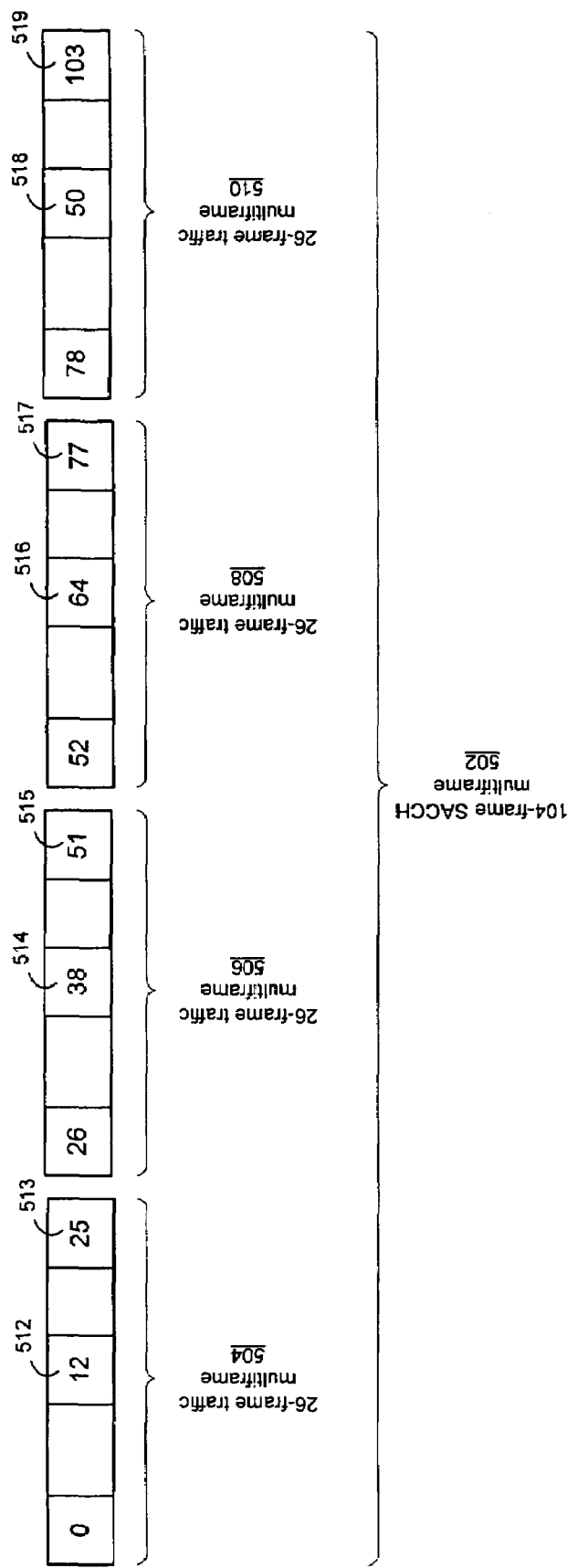
FIG. 5 is a diagram illustrating an exemplary SACCH multiframe, in connection with an embodiment of the invention.

FIG. 5 is a diagram illustrating an exemplary SACCH multiframe, in connection with an embodiment of the invention. Referring to FIG. 5, there is shown a 104-frame SACCH multiframe 502. The SACCH multiframe 502 may comprise a first traffic multiframe 504, a second traffic multiframe 506, a third traffic multiframe 508, and a fourth traffic multiframe 510. Also shown in FIG. 5 is a plurality of SACCH message frames 512, 514, 516, and 518, and a plurality of idle frames 513, 515, 517, and 519.

The plurality of SACCH message frames comprising 512, 514, 516 and 518 may be utilized transmit and/or receive a complete SACCH block 122. The transmitted and/or received SACCH block 122 may be. encoded. When an MS 102 receives a SACCH multiframe 502 via a downlink channel, each of the SACCH message frames 512, 514, 516 and 518 may comprise a corresponding burst 320a, 320b, 320c or 320d. When an MS 102 transmits a SACCH multiframe 502 via an uplink channel, each of the SACCH message frames 512, 514, 516 and 518 may comprise a corresponding burst 230a, 230b, 230c or 230d.

In various embodiments of the invention, the MS 102 may receive a signal wirelessly via a control channel. The control channel may be received via a downlink channel. The received control channel may be a SACCH. A current encoded information block may be received via the received signal. The encoded information block may be received at the MS 102 via at least a portion of SACCH message frames 512, 514, 516 and 518 that are transmitted in a SACCH multiframe 502. An encoded information block may be decoded to extract a received SACCH block 122. A complete SACCH block 122 may be received at the MS 102 once for every complete SACCH multiframe 502. The complete SACCH block 122 may comprise up to 184 bits. A time duration for a single complete SACCH multiframe may be about 480 ms. The processor 104 may enable computation of an adjusted encoded information block based on the current encoded information block and one or more previous encoded information blocks. One or more previous encoded information blocks may be weighted during the computation. The one or more previous encoded information blocks may be re-encoded during computation of the adjusted encoded information block.

In various embodiments of the invention, bits contained in the current encoded information block may comprise binary values that are substantially equal to binary values of corresponding bits in one or more previous encoded information blocks received by the MS 102. This characteristic may be referred to as repetition redundancy. Repetition redundancy may occur in wireless communications systems. The repetition redundancy may be utilized to decode control channels based on weighted bits.

Figure 6:
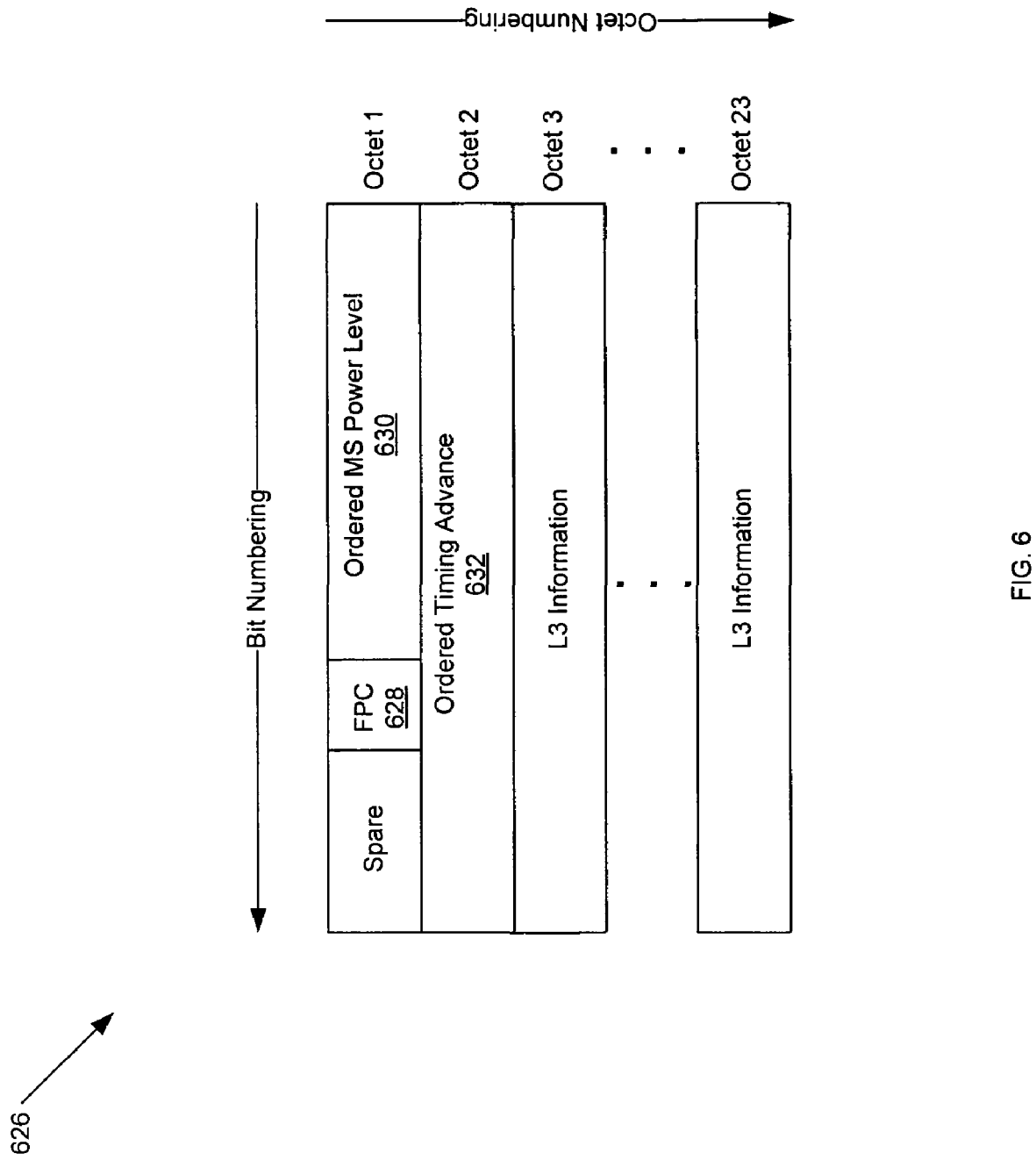
FIG. 6 is a block diagram of an exemplary downlink slow associated control channel (SACCH) block, which may be used in accordance with an embodiment of the invention.

FIG. 6 is a block diagram of an exemplary downlink slow associated control channel (SACCH) block, which may be used in accordance with an embodiment of the invention. A downlink SACCH block may be communicated by a base transceiver station (BTS), or by a node B station, to an MS 102. Referring to FIG. 6, the SACCH block 626 may comprise 23 octets for a total of 184 bits, for example. Octets 1 and 2 may comprise level 1 (L1) control information and octets 3, 4, . . . , 23 may comprise level 3 (L3) system information. The L1 control information may comprise fast power control (FPC) bit information 628, ordered mobile station power level 630, and ordered timing advance 632. The spare bits within the SACCH block 626 may be encoded with the binary value 0, for example.

The FPC bit 628 may have a different interpretation depending on the channel mode of the channel to which the SACCH 626 is associated. For example, if the channel mode for a wireless connection is such that FPC may be used, the FPC bit 628 may indicate whether Fast Measurement Reporting and Power Control mechanism may be used. The FPC bit 628 may be coded as 0 when fast power control is not used, and 1 when fast power control is in use.

The ordered mobile station (MS) power level 630 may be used by a base station, for example, to indicate a desired transmission power level to an associated mobile station. The ordered timing advance information 632 may be communicated from a base station (BS) to an associated MS and may be used by the MS to advance its timings of transmissions to the BS so as to compensate for propagation delay.

Figure 7A:
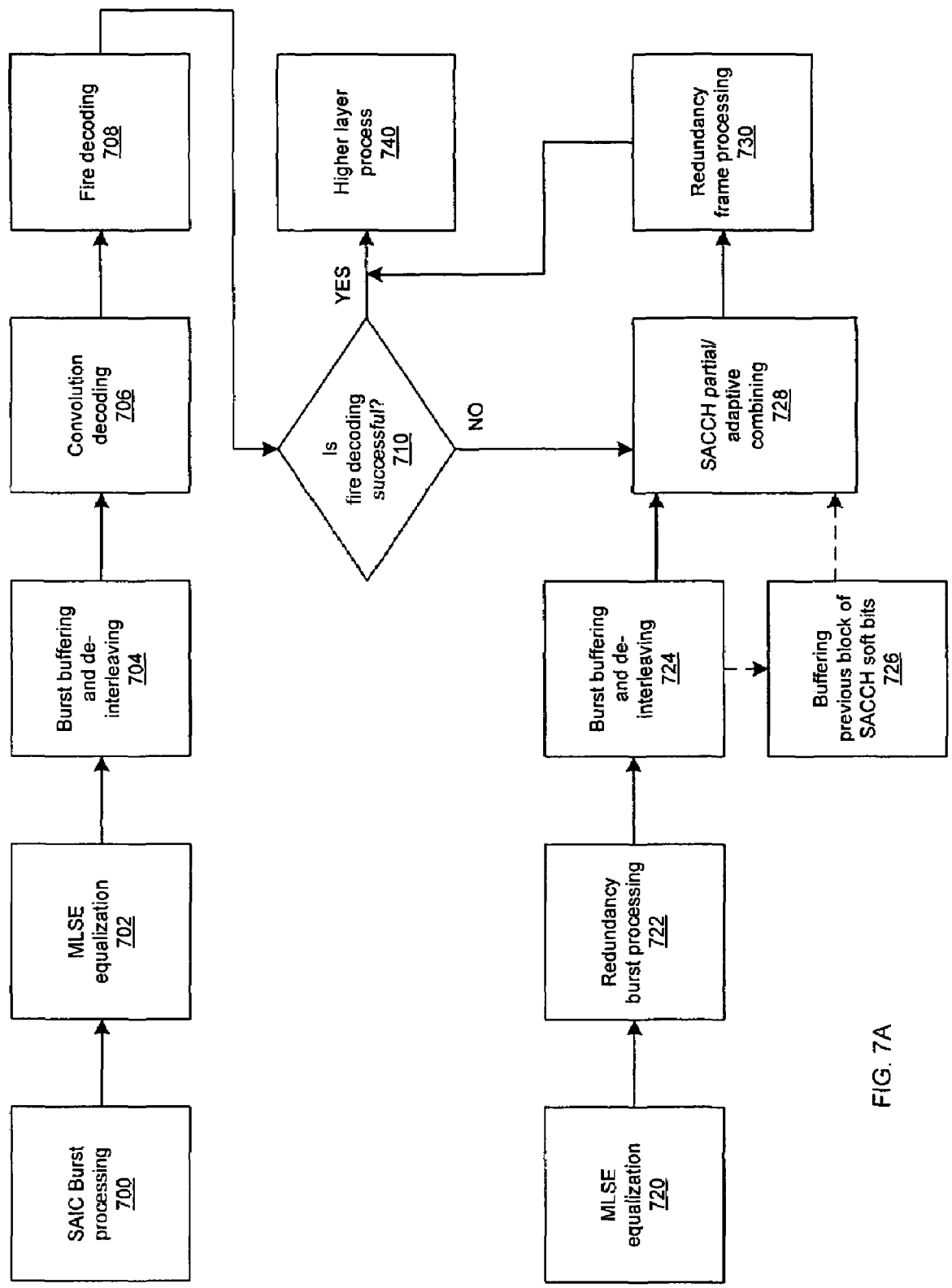
FIG. 7A is a flow diagram illustrating exemplary steps in decoding received data, in accordance with an embodiment of the invention.

FIG. 7A is a flow diagram illustrating exemplary steps in decoding received data, in accordance with an embodiment of the invention. Referring to FIG. 7A, the RFB 144 may receive a signal wirelessly via a control channel. The signal may comprise one of the bursts 320a, 320b, 320c, or 320d at a given time instant. Any one received burst may comprise at least a portion of a current encoded information block. A received signal may comprise a plurality of bits. The binary value for a bit may be represented by a signal level associated with the received signal. The received signal may be processed in parallel in steps 700 and 720. Step 700 may utilize SAIC processing to cancel at least a portion of one or more interfering signals received in addition to the burst signals 320a, 320b, 320c, and/or 320d.

In step 720, the received signal level may be adjusted by a maximum-likelihood sequence estimation (MLSE) equalization operation. The MLSE equalization operation may utilize received samples based on the input received signal levels. The MLSE equalization operation may comprise a channel estimation filter. In step 702, the received signal level may be adjusted, substantially as described in step 720, after SAIC processing. The RFB 144 may compute the appropriate Channel estimation based on a received training sequence 418 within the corresponding burst 320a, 320b, 320c, or 320d. In step 722, the equalized data may be processed using a redundancy burst processing algorithm. The redundancy burst processing algorithm further improves the received signal.

The U.S. application Ser. No. 11/189,634, filed on Jul. 26, 2005, and U.S. application Ser. No. 11/325,720 filed on even date herewith, disclose the redundancy burst processing algorithm in more detail, and are hereby incorporated herein by reference in their entirety.

The signal level may be represented as comprising an in-phase (I) component and/or a quadrature (Q) phase component. The RFB 144 may demodulate the received signal to derive the binary value for a bit corresponding to the signal level. The RFB 144 may derive the binary value by comparing the signal level to a threshold. For example, a signal level of 1 may correspond to a binary value of 1, and a signal level of −1 may correspond to a binary value of 0. The RFB 144 may compare the signal level to a threshold level, for example. If the signal level is greater than the threshold level, the corresponding binary value may be determined to be equal to 1. If the signal level is less than the threshold level, the corresponding binary value may be determined to be equal to 0. The process by which a binary value is determined based on a threshold level may be referred to as a hard decision. The corresponding bit, the binary value of is determined by a hard decision may be referred to as a hard decision bit.

For every hard decision, there is a probability that the hard decision is in error. For example, a hard decision may determine the binary value of a received bit to be 1 when the transmitted binary value of the corresponding transmitted bit was 0. The RFB 144 may compute a probability that the binary value of the corresponding hard decision bit is correct. The computed probability may comprise soft decision information. The convolutional decoder 148 and/or fire decoder 150 may utilize the binary value for the hard decision bit and corresponding soft decision information when decoding the corresponding encoded information block. Soft information may be computed in steps 702 and/or 720 based on the MLSE equalization operation.

In steps 704 and 724, after processing a single burst, for example a first burst 320a in a SACCH multiframe 502, the processed first burst 320a may be temporarily stored in memory 106. Once the complete set of bursts 320a, 320b, 320c, and 320d associated with a SACCH multiframe 502 have been received, the DBDB 146 may deinterleave bits in the received encoded information block.

In step 706, the de-interleaved data from the step 704, which may be convolutionally decoded by the convolutional decoder 148. In step 708, the convolutionally decoded data may be further decoded by the fire decoder 150 utilizing a Fire decoding algorithm. The convolutional decoding step 706 may utilize soft information. Consequently, the decoded bits may be referred to as soft decision bits, or soft bits. In step 710, the fire decoder 150 may determine if there were any bit errors detected in the received convolutionally decoded data that were not corrected during the fire decoding step 708. If not, the fire decoding 708 may be determined to have been successful in step 710 and step 740 may follow. If there were bit errors detected that were not corrected during the fire decoding step 708, the fire decoding 708 may be determined to have not been successful in step 710, and step 728 may follow.

In step 740, the decoded data may be communicated to higher layer processes for further processing also the successfully decoded bits Decoded_SMCH_bits$_n$ are saved in 726 for later use if in next SACCH will be received unsuccessfully. For example, the decoded data may be communicated to the processor 104. The processor 104 may perform content specific processing operations on the decoded data. For example, the received SACCH block 122 may comprise system information that was transmitted to the MS 102 by a base transceiver station (BTS).

In step 726, soft bits associated with the current information block may be buffered. The soft bits may comprise received samples based on input received signal levels. The current information block may comprise bits from the received encoded information block that is decoded. The buffered current information block and/or corresponding soft bits may be stored in the memory 106, for example. In step 728, the buffered current information block may be utilized for decoding a subsequent received encoded information block. At a subsequent time instant when the subsequent received encoded information block represents the current information block, the current information block may represent a previous information block. At the subsequent time instant when the subsequent received encoded information block is decoded, the current information block may be a previous encoded information block that is decoded. A re-encoded version of the previous encoded information block that is decoded may be utilized when decoding the current received encoded information block. An adjusted encoded information block may be computed based on the current received encoded information block and the re-encoded version of the previous encoded information block that is decoded.

In step 730, redundancy frame processing may be performed on the adjusted encoded information block. The redundancy frame processing may comprise convolutional decoding and/or fire decoding. The U.S. application Ser. No. 11/325,751, filed on even date herewith, discloses frame processing using redundancy-based decoding algorithms in more detail, and is hereby incorporated herein by reference in its entirety. The step 740 may follow step 730.

Figure 7B:
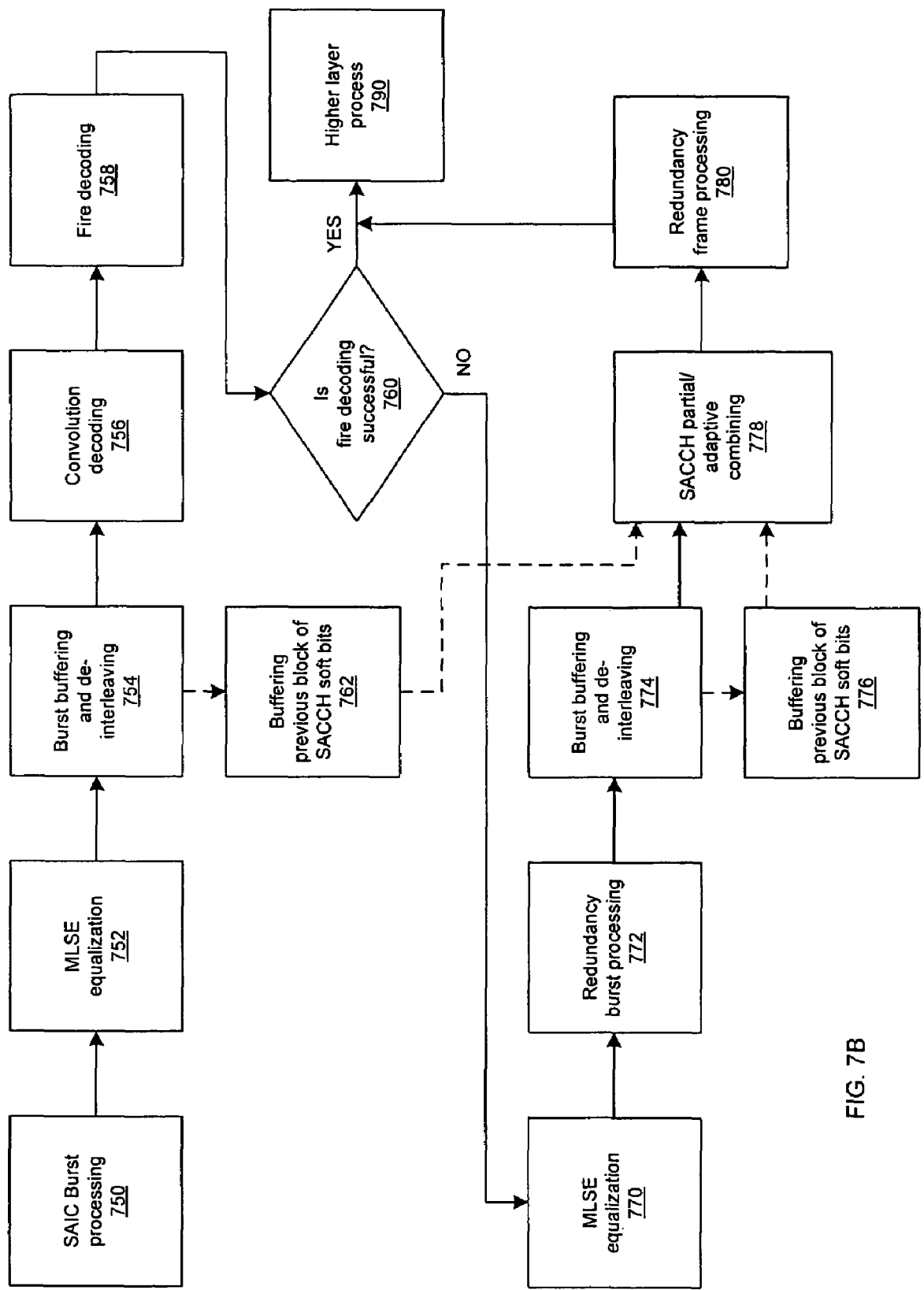
FIG. 7B is a flow diagram illustrating exemplary steps in decoding received data, in accordance with an embodiment of the invention.

FIG. 7B is a flow diagram illustrating exemplary steps in decoding received data, in accordance with an embodiment of the invention. FIG. 7B may comprise similar steps as FIG. 7A. However, the FIG. 7B flow diagram describes serial steps in decoding data, as opposed to parallel steps for decoding data. Referring to FIG. 7B, Step 750 may utilize SAIC processing to cancel at least a portion of one or more interfering signals received in addition to the burst signals 320a, 320b, 320c, and/or 320d. Step 750 may be substantially as described in step 700. In step 752, the received signal level may be adjusted based on an MLSE equalization operation. Step 752 may be substantially as described in step 702. In step 754, a received burst 320a, 320b, 320c, or 320d may be buffered, or stored, and subsequently de-interleaved. Step 754 may be substantially as described in step 704. In step 762, soft bits associated with the current information block received from step 754 may be buffered. Step 762 may be substantially as described in step 726. In step 756, the deinterleaved data from step 754 may be convolutionally decoded. Step 756 may be substantially as described for step 706. In step 758, the convolutionally decoded data may be further decoded by the fire decoder 150 utilizing a Fire decoding algorithm. Step 758 may be substantially as described for step 708.

In step 760, the fire decoder 150 may determine if there were any bit errors detected in the received convolutionally decoded data that were not corrected during the fire decoding step 758. If not, the fire decoding 758 may be determined to have been successful in step 760 and step 790 may follow. If there were bit errors detected that were not corrected during the fire decoding step 758, the fire decoding 758 may be determined to have not been successful in step 760, and step 770 may follow.

In step 770, the received signal level may be adjusted based on an MLSE equalization operation. Step 770 may be substantially as described in step 702. In step 772, the equalized data may be processed using a redundancy burst processing algorithm. Step 772 may be substantially as described in step 722. In step 774, a received burst 320a, 320b, 320c, or 320d may be buffered, or stored, and subsequently de-interleaved. Step 774 may be substantially as described in step 704. In step 776, soft bits associated with the current information block may be buffered. Step 776 may be substantially as described in step 726. In step 778, the buffered current information block may be utilized for decoding a subsequent received encoded information block. An adjusted encoded information block may be computed. Step 778 may be substantially as described in step 728. In step 780, redundancy frame processing may be performed on the adjusted encoded information block received from step 778. Step 780 may be substantially as described in step 730. Step 790 may follow step 780. As step 740, step 790 will store the successfully decoded bits Decoded_SAACH_bits$_n$ saved in 776 for later use if in next SACCH will be received unsuccessfully.

The U.S. application Ser. No. 11/189,634, filed on Jul. 26, 2005, and U.S. application Ser. No. 11/325,720, filed on even date herewith, disclose the redundancy burst processing algorithm in more detail, and are hereby incorporated herein by reference in their entirety.

Figure 8:
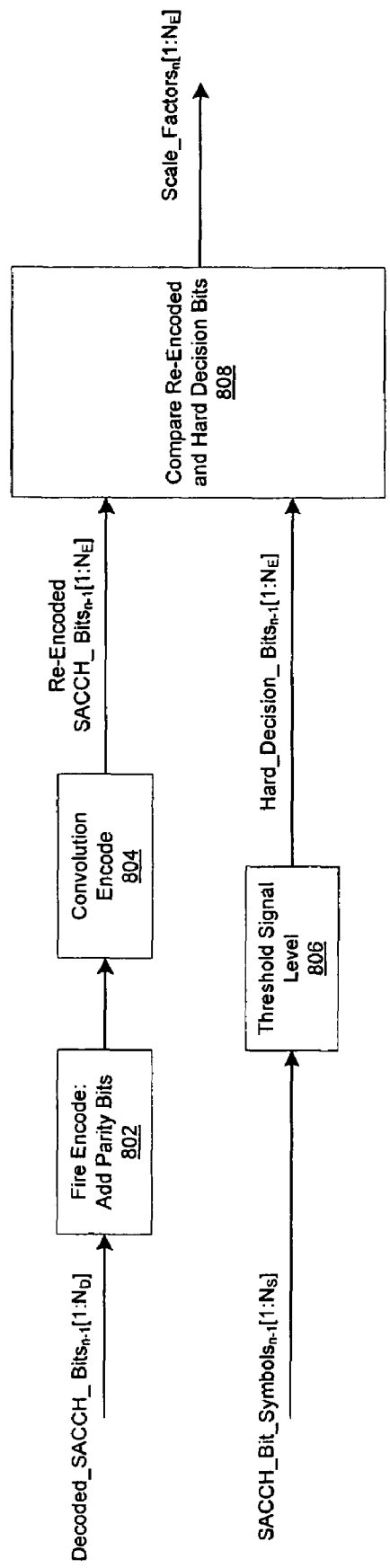
FIG. 8 is a flow diagram illustrating exemplary steps for deriving scale factors for weighted bit-by-bit combining, in accordance with an embodiment of the invention.

FIG. 8 is a flow diagram illustrating exemplary steps for deriving scale factors for weighted bit-by-bit combining, in accordance with an embodiment of the invention. FIG. 8 may provide further detail to describe the operation of step 728. FIG. 8 may also provide further detail to describe the operation of step 778. Referring to FIG. 8, step 802 may receive a plurality of decoded SACCH bits from a SACCH block in a previous SACCH multiframe 502. If the current SACCH block is received at a time instant referred to as t=n, then the plurality of decoded SACCH bits in step 802 may have been received via an encoded information block that is decoded at a time instant referred to as t=n−1. The plurality of decoded SACCH bits, referred to as Decoded_SACCH_Bits$_{n-1}$[1:N$_D$], may be numbered from 1 to N$_D$, where N$_D$ may represent the number of decoded SACCH bits. The value of N$_D$ may be less than or equal to 168 when combining is performed on bits contained in L3 information within the SACCH block 626, for example.

At step 802, the plurality of decoded SACCH bits may be re-encoded utilizing fire encoding at the current time instant t=n. At step 804, the plurality of fire encoded bits generated in step 802 may be further re-encoded utilizing convolutional encoding. A re-encoded plurality of SACCH bits, referred to as Re-encoded SACCH_Bits$_{n-1}$[1:N$_E$], may be generated. The SACCH bits may be numbered from 1 to N$_E$, where N$_E$ may represent the number of encoded SACCH bits.

At step 806, a plurality of symbols associated with bits in the previous SACCH multiframe 502, received at the time instant t=n−1, may be processed to derive a corresponding plurality of hard decision bits. The symbols may correspond to signal levels that may be demodulated to derive binary values for corresponding bits. The plurality of symbols, or signal levels, referred to as SACCH_Bit_Symbols$_{n-1}$[1:N$_S$], may be numbered from 1 to N$_S$, where N$_S$ may represent the number of symbols. At step 806, the plurality of signal levels may be compared to a threshold value. Based on the comparisons, a plurality of hard decision bits, or hard bits, referred to as Hard_Decision_Bits$_{n-1}$[1:N$_E$], may be generated. The plurality of hard decision bits may be numbered from 1 to N$_E$. In various embodiments of the invention, the number of symbols N$_S$ may be equal to the number of encoded bits N$_E$. The number of symbols may not be limited to being equal to the number of encoded bits.

In step 808, an m bit from a re-encoded version of a previous encoded information block that is decoded, Re-encoded SACCH_Bits$_{n-1}$[m], may be compared to a corresponding hard decision bit, Hard_Decision_Bits$_{n-1}$[m]. In an embodiment of the invention, an $m^{th}$ scale factor may be computed based on the following equation:

ScaleFactor$_{n-1}$[m]=¬(Re encoded_SACCH_Bits$_{n-1}$[m]⊕HardDecisionBits$_{n-1}$[m])  equation [1]

where the $m_{th}$ scale factor may be equal to a logical-XNOR of the corresponding re-encoded bit and the corresponding hard bit.

In another embodiment of the invention, an $m^{th}$ scale factor may be computed based on the following equation:

$$ScaleFactor_{n-1}[m] = \frac{1}{2W+1}\sum_{i=m-W}^{i=m+W} \neg(\text{Reencoded\_SACCH\_Bits}_{n-1}[i] \oplus \text{HardDecisionBits}_{n-1}[i])$$ equation [2]

where W may represent a number of hard bits preceding the $m^{th}$ hard bit in the plurality hard bits. The summation may represent a sum of logical-XNOR sums of the corresponding re-encoded $i^{th}$ re-encoded bits and hard bits. The value of the scale factor may be adjusted based on a threshold value.

Figure 9:
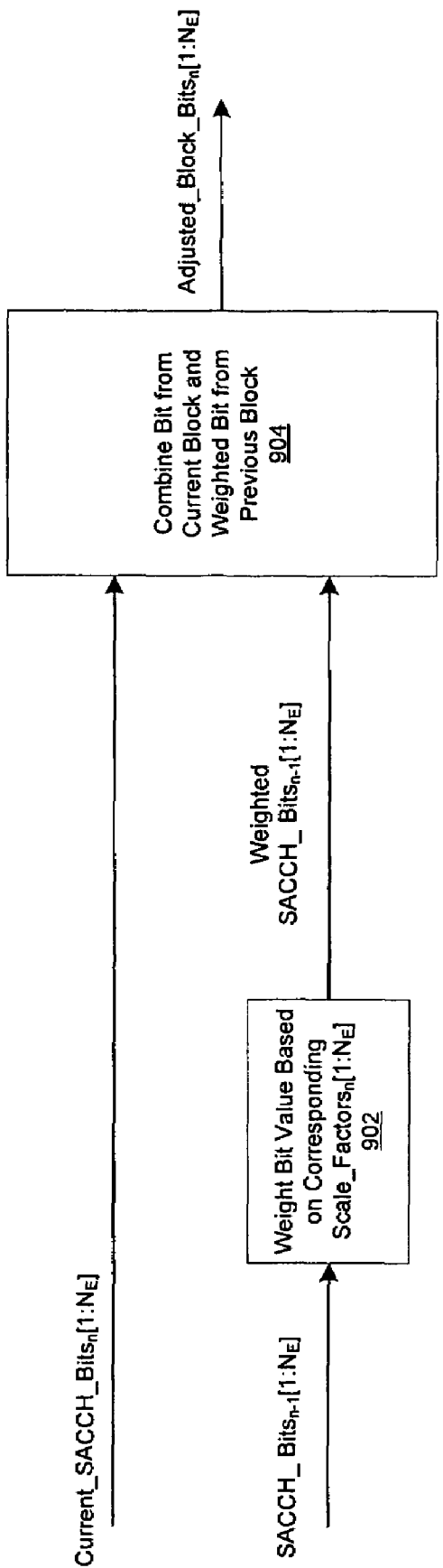
FIG. 9 is a flow diagram illustrating exemplary steps for deriving scale factors for weighted bit-by-bit combining, in accordance with an embodiment of the invention.

FIG. 9 is a flow diagram illustrating exemplary steps for deriving scale factors for weighted bit-by-bit combining, in accordance with an embodiment of the invention. Referring to FIG. 9, step 902 may plurality of SACCH bits from buffer 762 or 776 or buffer 726, referred to as SACCH_Bits$_{n-1}$[1:N$_E$],.

At step 902, an $m^{th}$ bit of a previous information block that is decoded successfully, SACCH_Bits$_{n-1}$[m], may be weighted by a scale factor as computed in equation [1], or equation [2], for example. A weighted SACCH bit, referred to as Weighted_SACCH_Bit$_{n-1}$[m] may be computed based on a multiplicative product as in the following equation:

Weighted_SACCH_Bit$_{n-1}$[m]=ScaleFactor$_{n-1}$[m]
*SACCH_Bit$_{n-1}$[m]  equation [3]

At step 904, an $m^{th}$ bit from the weighted bit may be combined with a corresponding bit from a current SACCH bit received in a current information block, Current_SACCH_Bits$_n$[m]. A corresponding $m^{th}$ bit in an adjusted encoded information block, Adjusted_Block_Bits$_n$[m], may be computed based on a logical-OR sum as in the following equation:

AdjustedBlockBit$_{n-1}$[m]=Current_SACCH_Bit$_n$[m]+
Weighted_SACCH_Bit$_{n-1}$[m]  equation [4]

In various embodiments of the invention, the Adjusted_Block_Bits$_n$[m] may represent a bit that is computed in connection with decoding control channels using repetition redundancy based on weighted bits.

Aspects of a system for decoding control channels using repetition redundancy based on weighted bits may include a processor 104 that enables receipt of a current encoded information block from a signal received wirelessly via a control channel. The control channel may be a slow associated control channel (SACCH). The processor 104 may also enable computation of an adjusted encoded information block based on the current encoded information block, and at least one previous encoded information block that is weighted. The processor 104 may enable computation of a bit in the adjusted encoded information block based on a corresponding bit in the current encoded information block, and a corresponding bit in the one or more previous encoded information blocks that are weighted. The processor 104 may enable computation of a value for the bit in the adjusted encoded information block based on a sum of a value for the corresponding bit in the current encoded information block, and a weighted value for the corresponding bit in the one or more previous encoded information blocks.

The processor 104 may enable computation of the weighted value for the corresponding bit based on a product of a scale factor and a value for the corresponding bit in the at least one previous encoded information block. The processor 104 may enable computation of the scale factor based on a value for a corresponding bit in a re-encoded version of the one or more previous encoded information blocks that are decoded, and a value for a corresponding hard decision bit. The processor 104 may enable computation of the scale factor based on a product of the value for the corresponding bit in the re-encoded version, and the value for the corresponding hard decision bit. The processor 104 may enable computation of the value for the corresponding hard decision bit based on a signal level associated with a previous received signal. The signal level may be compared to a threshold level.

The processor 104 may also enable computation of the scale factor based on a numerator sum that comprises a value corresponding to a product of the value for the corresponding bit in the re-encoded version, and the value for the corresponding hard decision bit. The numerator sum may also comprise a sum of at least one value corresponding to at least one product of a value for a previous bit to the corresponding bit in the re-encoded version, and value for a corresponding previous hard decision bit. The numerator sum may further comprise a sum of at least one value corresponding to at least one product of a value for a subsequent bit to the corresponding bit in the re-encoded version, and value for a corresponding subsequent hard decision, bit. The numerator sum may be divided by a divisor sum. The divisor sum may include a value corresponding to a number of the corresponding hard decision bit, a value corresponding to a number of the previous hard decision bits, and a value corresponding to a number of the subsequent hard decisions bits.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for decoding signals received via a wireless communication channel, the method comprising:
   receiving a current encoded information block from a signal received wirelessly via a control channel;
   computing an adjusted encoded information block based on said current encoded information block and at least one previous encoded information block that is weighted;
   computing a bit in said adjusted encoded information block based on a corresponding bit in said current encoded information block and a corresponding bit in said at least one previous encoded information block that is weighted; and
   computing a value for said bit in said adjusted encoded information block based on a sum of: a value for said corresponding bit in said current encoded information block and a weighted value for said corresponding bit in said at least one previous encoded information block.

2. The method according to claim 1, comprising computing said weighted value for said corresponding bit based on a product of: a scale factor and a value for said corresponding bit in said at least one previous encoded information block.

3. The method according to claim 2, comprising computing said scale factor based on a value for a corresponding bit in a re-encoded version of said at least one previous encoded information block that is decoded and a value for a corresponding hard decision bit.

4. The method according to claim 3, comprising computing said scale factor based on a product of: said value for said corresponding bit in said re-encoded version and said value for said corresponding hard decision bit.

5. The method according to claim 3, comprising computing said value for said corresponding hard decision bit based on a signal level associated with a previous received signal.

6. The method according to claim 5, wherein said signal level is compared to a threshold level.

7. The method according to claim 3, comprising computing said scale factor based on a numerator sum, said numerator sum comprising at least one of the following:
   a value corresponding to a product of: said value for said corresponding bit in said re-encoded version and said value for said corresponding hard decision bit;
   a sum of at least one value corresponding to at least one product of: a value for a previous bit to said corresponding bit in said re-encoded version and value for a corresponding previous hard decision bit; and
   a sum of at least one value corresponding to at least one product of: a value for a subsequent bit to said corresponding bit in said re-encoded version and value for a corresponding subsequent hard decision bit.

8. The method according to claim 7, wherein said numerator sum is divided by a divisor sum, said divisor sum comprising:
   a value corresponding to a number of said corresponding hard decision bits;
   a value corresponding to a number of said previous hard decision bits; and
   a value corresponding to a number of said subsequent hard decisions bits.

9. The method according to claim 1, wherein said control channel is a slow associated control channel (SACCH).

10. A system for decoding signals received via a wireless communication channel, the system comprising:
    one or more circuits operable to receive a current encoded information block from a signal received wirelessly via a control channel;
    said one or more circuits are operable to compute an adjusted encoded information block based on said current encoded information block and at least one previous encoded information block that is weighted;
    said one or more circuits are operable to compute a bit in said adjusted encoded information block based on a corresponding bit in said current encoded information block and a corresponding bit in said at least one previous encoded information block that is weighted; and
    said one or more circuits are operable to compute a value for said bit in said adjusted encoded information block based on a sum of: a value for said corresponding bit in said current encoded information block and a weighted value for said corresponding bit in said at least one previous encoded information block.

11. The system according to claim 10, wherein said one or more circuits are operable to compute said weighted value for said corresponding bit based on a product of: a scale factor and a value for said corresponding bit in said at least one previous encoded information block.

12. The system according to claim 11, wherein said one or more circuits are operable to compute said scale factor based on a value for a corresponding bit in a re-encoded version of said at least one previous encoded information block that is decoded and a value for a corresponding hard decision bit.

13. The system according to claim 12, wherein said one or more circuits are operable to compute said scale factor based on a product of: said value for said corresponding bit in said re-encoded version and said value for said corresponding hard decision bit.

14. The system according to claim 12, wherein said one or more circuits are operable to compute said value for said corresponding hard decision bit based on a signal level associated with a previous received signal.

15. The system according to claim 14, wherein said signal level is compared to a threshold level.

16. The system according to claim 12, wherein said one or more circuits are operable to compute said scale factor based on a numerator sum, said numerator sum comprising at least one of the following:
- a value corresponding to a product of: said value for said corresponding bit in said re-encoded version and said value for said corresponding hard decision bit;
- a sum of at least one value corresponding to at least one product of: a value for a previous bit to said corresponding bit in said re-encoded version and value for a corresponding previous hard decision bit; and
- a sum of at least one value corresponding to at least one product of: a value for a subsequent bit to said corresponding bit in said re-encoded version and value for a corresponding subsequent hard decision bit.

17. The system according to claim 16, wherein said numerator sum is divided by a divisor sum, said divisor sum comprising:
- a value corresponding to a number of said corresponding hard decision bits;
- a value corresponding to a number of said previous hard decision bits; and
- a value corresponding to a number of said subsequent hard decisions bits.

18. The system according to claim 10, wherein said control channel is a slow associated control channel (SACCH).

* * * * *